US008729486B2

(12) United States Patent
Daghighian et al.

(10) Patent No.: US 8,729,486 B2
(45) Date of Patent: May 20, 2014

(54) MODFET ACTIVE PIXEL X-RAY DETECTOR

(75) Inventors: Henry M. Daghighian, Santa Clara, CA (US); Peter D. Olcott, Stanford, CA (US); Craig S. Levin, Palo Alto, CA (US); Farhad Taghibakhsh, Redwood City, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 184 days.

(21) Appl. No.: 13/135,122

(22) Filed: Jun. 23, 2011

(65) Prior Publication Data

US 2012/0025087 A1    Feb. 2, 2012

Related U.S. Application Data

(60) Provisional application No. 61/398,351, filed on Jun. 23, 2010, provisional application No. 61/519,334, filed on May 19, 2011.

(51) Int. Cl.
*G01T 1/24* (2006.01)
*H01L 29/66* (2006.01)
*G01T 1/00* (2006.01)

(52) U.S. Cl.
CPC ............ *G01T 1/24* (2013.01); *H01L 29/66462* (2013.01); *G01T 1/00* (2013.01)
USPC ........................................................ 250/370.1

(58) Field of Classification Search
CPC ... H01L 29/66462; H01L 31/119; G01T 1/24; G01T 1/00
USPC ........................................................ 250/370.1
See application file for complete search history.

(56) References Cited

U.S. PATENT DOCUMENTS

| 4,821,093 A * | 4/1989 | Iafrate et al. .................. 257/194 |
| 5,270,798 A * | 12/1993 | Pao et al. ..................... 257/134 |
| 2002/0033521 A1* | 3/2002 | Matsuoka ...................... 257/627 |

(Continued)

FOREIGN PATENT DOCUMENTS

JP    08316522 A    * 11/1996

OTHER PUBLICATIONS

Romero et al., "An analytical model for the photodetection mechanisms in high-electron mobility transistors", 1996, pp. 2279-2287, IEEE Trans. microwave theory and techniques, v44n12.

(Continued)

*Primary Examiner* — Marcus Taningco
(74) *Attorney, Agent, or Firm* — Lumen Patent Firm (57) ABSTRACT

Detection of ionizing radiation with modulation doped field effect transistors (MODFETs) is provided. There are two effects which can occur, separately or together. The first effect is a direct effect of ionizing radiation on the mobility of electrons in the 2-D electron gas (2DEG) of the MODFET. An ionizing radiation absorption event in or near the MODFET channel can perturb the 2DEG mobility to cause a measurable effect on the device conductance. The second effect is accumulation of charge generated by ionizing radiation on a buried gate of a MODFET. The conductance of the MODFET can be made sensitive to this accumulated charge, thereby providing detection of ionizing radiation. 1-D or 2-D arrays of MODFET detectors can be employed to provide greater detection area and/or spatial resolution of absorption events. Such detectors or detector pixels can be integrated with electronics, such as front-end amplification circuitry.

19 Claims, 6 Drawing Sheets

(56) References Cited

U.S. PATENT DOCUMENTS

| | | | |
|---|---|---|---|
| 2002/0070389 A1* | 6/2002 | Song | 257/194 |
| 2005/0258431 A1* | 11/2005 | Smith et al. | 257/79 |
| 2006/0006414 A1* | 1/2006 | Germain et al. | 257/192 |
| 2008/0088982 A1 | 4/2008 | Folks et al. | |
| 2009/0078966 A1* | 3/2009 | Asai et al. | 257/194 |
| 2010/0006892 A1* | 1/2010 | Kawano et al. | 257/187 |
| 2010/0025589 A1 | 2/2010 | Olcott et al. | |
| 2011/0068372 A1 | 3/2011 | Ren et al. | |
| 2012/0139084 A1* | 6/2012 | Hagleitner et al. | 257/615 |

OTHER PUBLICATIONS

Claspy et al., "High frequency GaAlAs modulator and photodetector for phased array antenna applications", 1988, pp. 1-12, NASA technical memorandum 101328.

Boardman et al., "Design and characterization of high electron mobility transistors for use in a monolithic GaAs X-ray imaging sensor", 2001, pp. 226-231, Nuclear instruments and methods in plasma research, A 466.

Hofstetter et al., "Development and evaluation of gallium nitride-based thin films for x-ray dosimetry", May 4, 2011, pp. 3215-3231, Physics in medicine and biology, v56.

Lee et al., "Nitride-based MSM photodetectors with a HEMT structure and a low-temperature AlGaN intermediate layer", 2008, pp. H959-H963, Journal of hte electrochemical society, v155n12.

Fetterman et al., "Integrated optically driven millimeter wave sources and receivers", 1994, pp. 1493-1496, IEEE MTT-S Digest.

Hofstetter et al., "Real-time x-ray response of biocompatible solution gate AlGaN/GaN high electron mobility transistor devices", Mar. 5, 2010, pp. 092110 1-092110 3, Applied Physics Letters, v96.

* cited by examiner

MODFET ACTIVE PIXEL X-RAY DETECTOR

CROSS REFERENCE TO RELATED APPLICATIONS

This application claims the benefit of U.S. provisional patent application 61/398,351, filed on Jun. 23, 2010, entitled "High speed radiation detection using MODFET semiconductor device", and hereby incorporated by reference in its entirety. This application also claims the benefit of U.S. provisional patent application 61/519,334, filed on May 19, 2011, entitled "MODFET active pixel X-ray detector", and hereby incorporated by reference in its entirety.

FIELD OF THE INVENTION

This invention relates to detection of ionizing radiation.

BACKGROUND

Semiconductor devices have been employed for some time in connection with detection of ionizing radiation. Often, the charge liberated by a detection event is directly measured. An article by Boardman et al., (Nuclear Instruments and Methods in Physics Research A 466 (2001) 226-231) is representative of this approach. Here, a semi-insulating GaAs wafer serves as a detector element and as the substrate for an integrated charge readout matrix. Charges generated in this substrate are collected by the readout matrix to provide the sensor output.

Another well known approach is the use of the photoconductive effect, where incident ionizing radiation generates charge carriers in a photoconductive device, thereby increasing its conductance.

However, it remains challenging to provide detection of ionizing radiation with detectors that simultaneously provide high performance (e.g., high speed and high sensitivity) and ease of integration with other circuitry, such as front end amplification electronics. Accordingly, it would be an advance in the art to provide such sensors for ionizing radiation.

SUMMARY

The mobility of electrons in the channel of a field effect transistor (FET) can be greatly improved by removing scattering centers (e.g., ionized donors) from the channel. Transistors that exploit this principle are referred to as modulation doped FETs (MODFETs) or high electron mobility transistors (HEMTs). Current flow between source and drain in such transistors flows through a channel which includes a 2-D electron gas formed in undoped material. The high mobility of the electrons in this 2-D electron gas results from the relative lack of electron scattering centers in undoped material, compared to doped material, and results in high speed and high amplification power of MODFET or HEMT transistors.

In the present invention, these characteristics of MODFET/HEMT devices are exploited to provide detection of ionizing radiation (e.g., X-rays, gamma rays, and/or particles such as electrons and positrons). More specifically, if ionizing radiation is absorbed by the undoped material of a MODFET in the vicinity of the channel, physical effects such as impact ionization, plasma renormalization and/or donor ionization can lead to the formation of temporary electron scattering centers. These scattering centers can affect the mobility of electrons in the channel, and thereby provide a sensor output responsive to received ionizing radiation.

Alternatively, a buried gate in MODFETs based on double heterostructures can be employed to collect charges generated by absorption of ionizing radiation. Charge on the buried gate can strongly affect the channel conductance of the MODFET, thereby providing alternative methods of detecting ionizing radiation. 2-D arrays of MODFET detectors can be employed to provide greater detection area and/or spatial resolution of detection events.

These approaches provide significant advantages. It is possible to provide high speed photon counting for ionizing radiation of sufficiently high energy, and it further provides the possibility of high speed energy measurement for each detected ionizing radiation photon. This approach is applicable for improving performance (e.g., improving signal to noise ratio (SNR)) in any imaging application, such as digital mammography, X-ray imaging, computed tomography, etc. Improved SNR can directly lead to other advantages, such as reduced radiation dose to a patient for the same image quality. Photon counting+energy analysis cannot be performed with present-day X-ray detector technology.

DETAILED DESCRIPTION

A) Basic MODFET Operation

Figure 1:
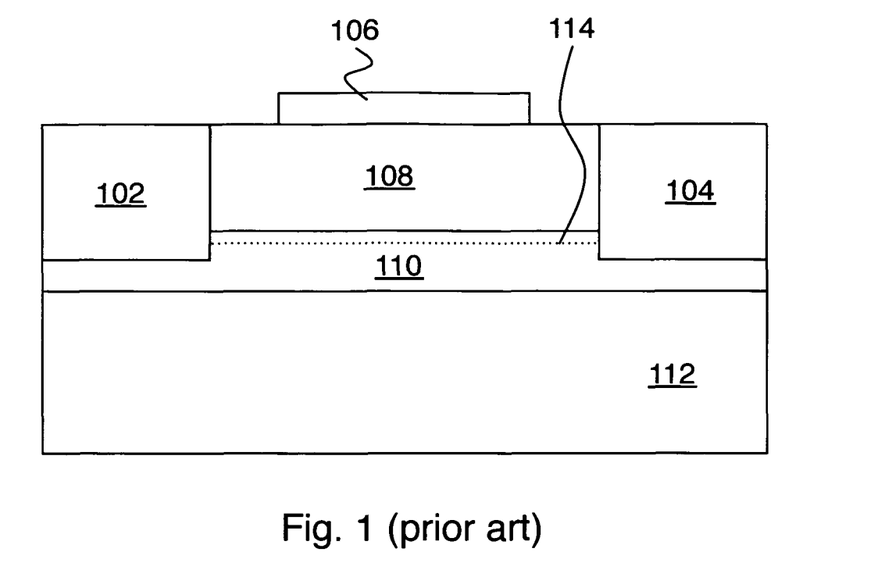
FIG. 1 shows a simple structure of a generic MODFET (prior art).
Figure 2:
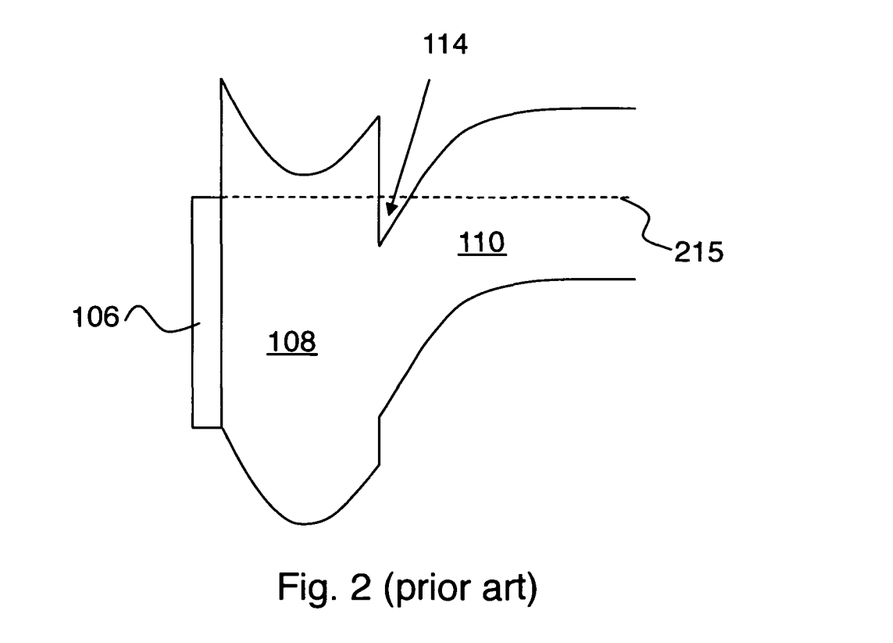
FIG. 2 shows the energy band diagram relating to the MODFET structure of FIG. 1 (prior art).

Modulation doped field effect transistors (MODFETs) operate based on the presence of an ultra-fast electronic conduction channel, often referred to as a 2-dimensional electron gas (2DEG). FIG. 1 shows an example of a MODFET device, and FIG. 2 shows a corresponding energy band diagram. In this example, a conductance between a source 102 and a drain 104 is controlled by a gate 106. A barrier layer 108 separates gate 106 from channel layer 110, built on the substrate (112). Barrier layer 108 and channel layer 110 form a heterostructure as shown on FIG. 2. Barrier layer 108 has a higher bandgap than channel layer 110. Channel layer 110 is undoped, while barrier layer 108 is doped. The doping of layer 108 is preferably away from layer 110 (e.g., as can be obtained with the delta doping technique, or the inclusion of doped and undoped sub-layers within barrier layer 110). The Fermi level is shown on FIG. 2 as a horizontal line 215. Adjusting the voltage at gate 106 shifts the Fermi level vertically on FIG. 2, thereby affecting the electron concentration in the channel layer. More specifically, a 2-D electron gas (2DEG, 114) in the quantum well 214 can form at the interface between layers 108 and 110.

The hetero-junction formed by different band gap materials forms a quantum well (i.e., a triangular well having a knife edge) in the conduction band of the un-doped channel layer. Electrons in the 2DEG are confined to the quantum well, and therefore do not experience scattering from ionized donors because the ionized donors are away from the quantum well. The effect of this is to create a very thin layer of highly mobile conducting electrons with high concentration giving the channel very high electron mobility. Thus, such transistors are also known as high electron mobility transistors (HEMTs). In this description, the terms HEMT and MODFET are regarded as synonyms and used interchangeably.

The 2-D electron gas in MODFETs allows super fast electrical current transmission across the source and drain of the MODFET and it is available largely due to lack of charged ions and coulomb scattering centers in the un-doped channel layer. 600 GHZ bandwidth has been achieved and MMIC (microwave monolithic integrated circuit) structures are commonplace with HEMT technology.

A1) MODFET Types

In a pseudomorphic HEMT (PHEMT) a lower noise/faster MODFET structure can be achieved by using an extremely thin layer of one of the materials (i.e., so thin that the crystal lattice of the thin layer stretches to fit the other material). This technique allows the construction of transistors with larger band gap differences than otherwise possible, giving them better performance.

Another way to use materials of different lattice constants is to place a buffer layer between them. This is done in the MHEMT or meta morphic HEMT (e.g., using InAs and AlInAs). In this example, the buffer layer is made of AlInAs with indium concentration graded so that it can match the lattice constant of both the substrate and the n-type channel. This brings the advantage that practically any indium concentration of the channel can be realized so that devices can be optimized for different applications (e.g., low indium concentration provides low noise, and high indium concentration provides high gain).

A2) MODFET: Basic Operation as an Amplifier

By applying a reverse bias voltage to the gate of a MODFET, the voltage applied to the gate alters the conductance of the channel by altering the carrier concentration in the 2DEG. As more negative bias is applied, the 2d electron gas is depleted. This results in the modulation of the channel conductance. Gain and amplification occur until the channel is pinched off (fully depleted). The transconductance is given by $g_m = \tilde{\epsilon} v_{sat} w_g / d$ where $\tilde{\epsilon}$ is the permittivity, $v_{sat}$ is the saturated velocity, $w_g$ is the unit gate width of device, and d is the distance from the gate to the 2d electron gas. Since conduction of electrons from source to drain occurs in a channel that is well confined, $g_m$ will be kept high with low drain currents.

A3) Specific MODFET Examples (Single-MODFETs)

MODFET technology is well known in the art, so the MODFET structure shown on FIG. 1 is simplified for convenience of exposition.

Single-MODFET structures have been used in variety of configurations for detection and sensing of chemicals (Ren: US patent application 2011/0068372), magnetic field (Folks: US patent application 2008/0088982), or even ionizing radiation. Hofstetter et al (in Applied Physics Letters, 96, 2010) report on application of such a device for radiation detection where the radiation is absorbed in a liquid medium and resulting charges are coupled to the gate of the device. In all these, and other similar works, the generated charge as the result of detection is coupled to the gate of the single-MODFET device to modulate the channel conductance. In an integrated approach, Boardman (Nuclear Instruments and Methods in Physics Research A 466-2001) reports on use of MODFETs as a passive switch for conducting the radiation induced charges to a readout circuit (a passive pixel architecture).

A4) Specific MODFET Example (Double-MODFETs)

Figure 3:
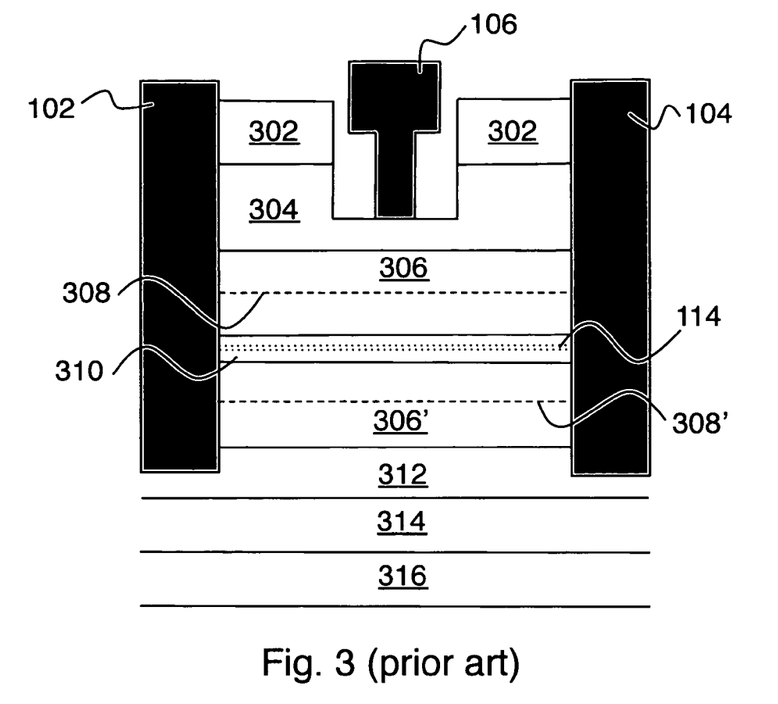
FIG. 3 is an exemplary device structure for a double-MODFET (prior art).

MODFET technology is also well known for high power applications, where the high mobility channel helps reduce the power loss in the device and prevent over heating. In order to further improve the channel conductivity for power applications, double heterostructures haven been used in MODFETs resulting in devices generally known as double-MODFETs or double-HEMTs. In double-MODFETs the configuration of layers around the channel is symmetric in order to widen the channel for better conductance. FIG. 3 shows an example of a double-MODFET structure. Here 102, 104 and 106 are the source, drain and gate, as above. Layer 302 is n+ GaAs, layer 304 is n-type AlGaAs, layer 306 is undoped AlGaAs (a first spacer layer), 308 is an n+ delta doping within 306, layer 310 is undoped GaAs (the channel layer as above), layer 306' is undoped AlGaAs (the second spacer layer), 308' is n+ delta doping within 306', layer 312 is n-type AlGaAs, layer 314 is p GaAs (buffer layer) and layer 316 is a GaAs semi-insulating substrate.

Figure 4:
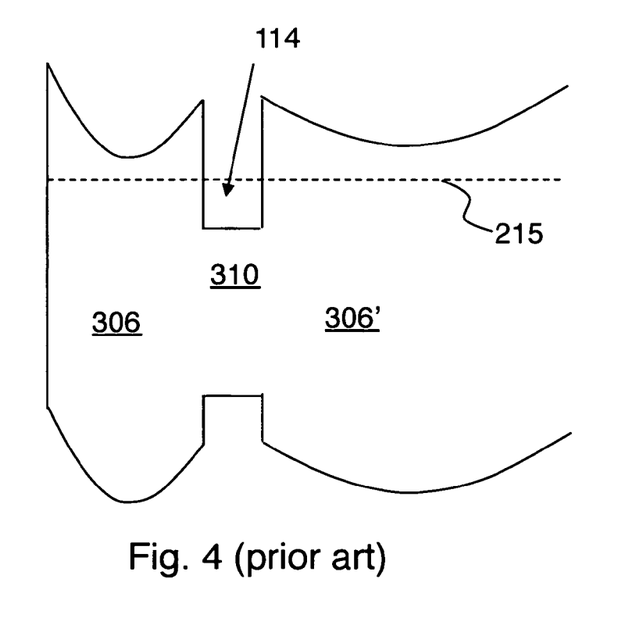
FIG. 4 shows the energy band diagram relating to the double-MODFET structure of FIG. 3 (prior art).

As shown in the band diagram of FIG. 4, the double heterostructure of FIG. 3 results in a wide quantum well (formed by layer 310) for better channel conduction compared to the knife-edge narrow quantum well band structure of a single-MODFET (e.g., as shown on FIG. 2).

B) MODFET Based Fast Radiation Detection

MODFET transistors (and their relatives such as double-MODFETs, PHEMT, MHEMT etc.) rely on an un-doped substrate with no ionized donors/coulomb scattering centers to maintain the 2-D electron gas operation. In presence of high energy radiation such as X-rays and gamma rays and nuclear particles, the substrate material of a MODFET can experience impact ionization and/or plasma renormalization. This is shown schematically as absorption 522 of ionizing radiation 520 on FIG. 5. High-Z substrate materials are preferred because of their greater absorbance of ionizing radiation. The energy transfer from the ionizing radiation results in perturbation of the 2D electron gas (e.g., by creating temporary coulomb scattering centers that act similar to ionized donor scattering centers). As a result, the conductance of the channel between the MODFET source and drain can be affected by the ionizing radiation, thereby enabling the MODFET to act as a radiation sensor.

Figure 5:
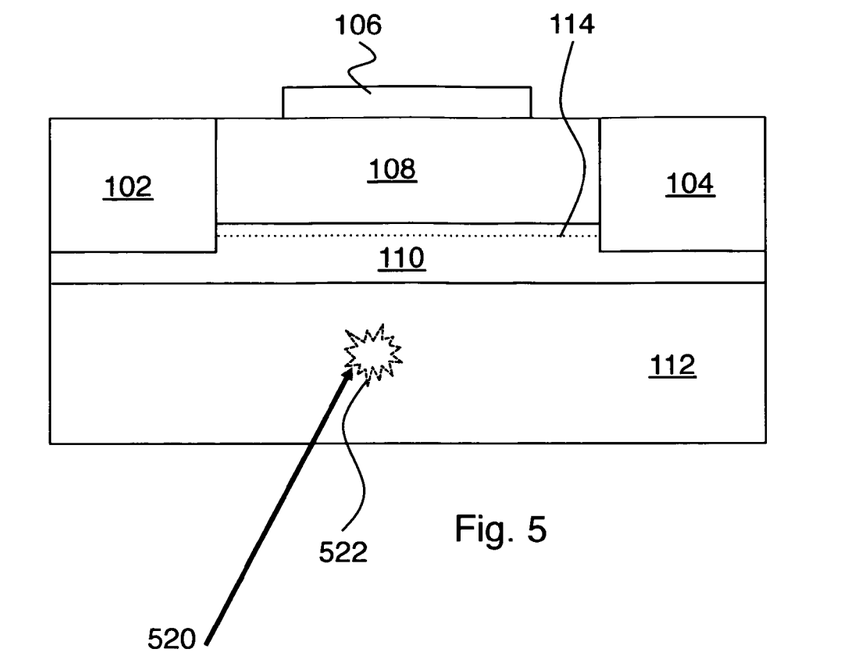
FIG. 5 shows an embodiment of the invention exploiting a MODFET as a high speed radiation detector.

An example method of the present invention is shown in FIG. 5 where a MODFET (single or double) is used for detection and measurement of radiation absorbed in an absorbing region 112 which is disposed at and/or in proximity to channel 110, and is capable of absorbing ionizing radiation. As used herein, ionizing radiation refers to electromagnetic or particle radiation having a photon or particle energy of about 20 keV or greater. Absorption 522 of ionizing radiation 520 in absorbing region 112 can alter the conductance provided by the electrons in the 2DEG, thereby enabling the MODFET to act as a sensor for ionizing radiation. In many cases, it is preferred for absorbing region 112 to be fabricated in a different material system than the other MODFET layers (e.g., 102, 104, 108, 110).

C) Buried Gate Double-MODFET

Figure 6:
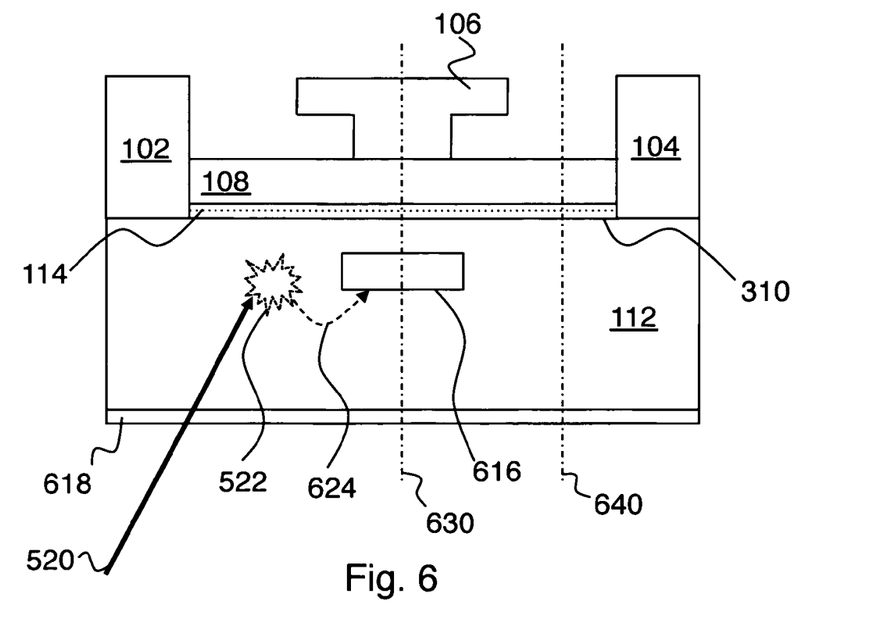
FIG. 6 shows an embodiment of the invention having a buried gate in a double-heterostructure MODFET.

In a preferred embodiment, a buried gate is added to the double-MODFET configuration as described above to further enhance radiation detection. FIG. 6 shows an example of this approach.

Here, the conductance of a channel for current flow between a source 102 and a drain 104 is set by a gate 106. As described above, a 2DEG 114 can form in channel layer 310 to provide a path for this current flow. Layers 108 and 310 form a heterostructure, as do layers 310 and 112, thereby making the device of this example a double-heterostructure MODFET. The device of this example can directly read charge created in, or injected into, bulk substrate (i.e., absorption region) 112 using a buried n-doped region that operates as a gate 616 underneath channel layer 310. More specifically, absorption 522 of ionizing radiation 520 can generate charge which can accumulate on buried gate 616 (as schematically shown by 624). It is convenient to refer to this kind of device as a double-gate double-MODFET (DGDMODFET) device. In some cases, it can be useful to make contact to the back side of the device with back side contact 618.

It is worth noting that unlike in conventional field effect transistors (such as silicon MOS transistors) where a buried gate can be simply added below the channel (for example to form a depFET), a buried gate will not work if added to a conventional MODFET; buried gates work on double-MODFETs only. Double heterostructures are essential for proper operation of such devices.

Practice of the invention does not depend critically on the materials used for the MODFET sensor. Any materials capable of absorbing ionizing radiation and compatible with MODFET technology can be employed. Suitable material systems include, but are not limited to: SiGe, GaAs, HgCdTe, and CdZnTe. In one preferred embodiment, the MODFET is fabricated in the HgCdTe system and is lattice matched to the absorption region which is grown in the CdZnTe system.

C1) Buried Gate MODFET Theory

To better appreciate the buried gate MODEFT approach, it is helpful to consider a simple model of device performance. We define the following quantities:

$C_g$ is effective capacitance per unit area of the un-doped channel between the gate and the channel.
$\mu_n$ is the mobility of electrons in the 2DEG.
$V_{gs}$ is the gate source voltage between the back gate and the channel.
$V_t$ is the sum of the intrinsic threshold voltage of the device plus the top metal gate-source voltage (from gate 106).
$\Delta Q$ is the charge collected at the back gate 116 from the substrate 112.
$C_{bg}$ is the sum of all capacitance that the buried gate sees.

The basic device equations are given by:

$$I_d = \frac{W}{L} C_g \mu_n (V_{gs} - V_t)^2$$

$$\frac{\partial I_d}{\partial V_{gs}} = 2\frac{W}{L} C_g \mu_n (V_{gs} - V_t)$$

$$\partial V_{gs} = \frac{\Delta Q}{C_{bg}}$$

$$C_{bg} = W \cdot L \cdot C_g + C_{parasitic}$$

The HEMT device has a higher mobility, and lower capacitance than the standard MOSFET. Assuming the device is biased where $V_t$ is constant and substituting in $V_{gs}$, then the basic equations give:

$$\Delta I_d = 2\frac{W}{L} C_g \mu_n \left(\frac{\Delta Q}{W \cdot L \cdot C_g + C_{parasitic}}\right) \cdot (V_{gs} - V_t)$$

Because the substrate is very lightly doped, and the drain and source are relatively far away, we can assume that C-parasitic is small compared to the gate capacitance, which gives:

$$\Delta I_d = 2\frac{\mu_n}{L^2} \Delta Q \cdot (V_{gs} - V_t) \quad (1)$$

Therefore, the change in current seen at the drain is inversely related to the length of the device squared times the mobility of the carriers in the 2DEG. Because the carriers in a HEMT device travel in an un-doped layer, they can reach the theoretical mobility of the semiconductor. Additionally, this device can outperform MOS devices in terms of input referred noise because of its higher mobility/gain and substantially smaller sensing node capacitance (no oxide, no line or contact capacitance).

The charges on the buried gate can be cleared in two ways. First, the buried gate can be engineered to have a certain carrier lifetime by allowing the electrons to tunnel into the channel based on the distance. Secondly, the top gate 106 of the device can be forward biased, thereby clearing the accumulated charge from buried gate 116.

Figure 7:
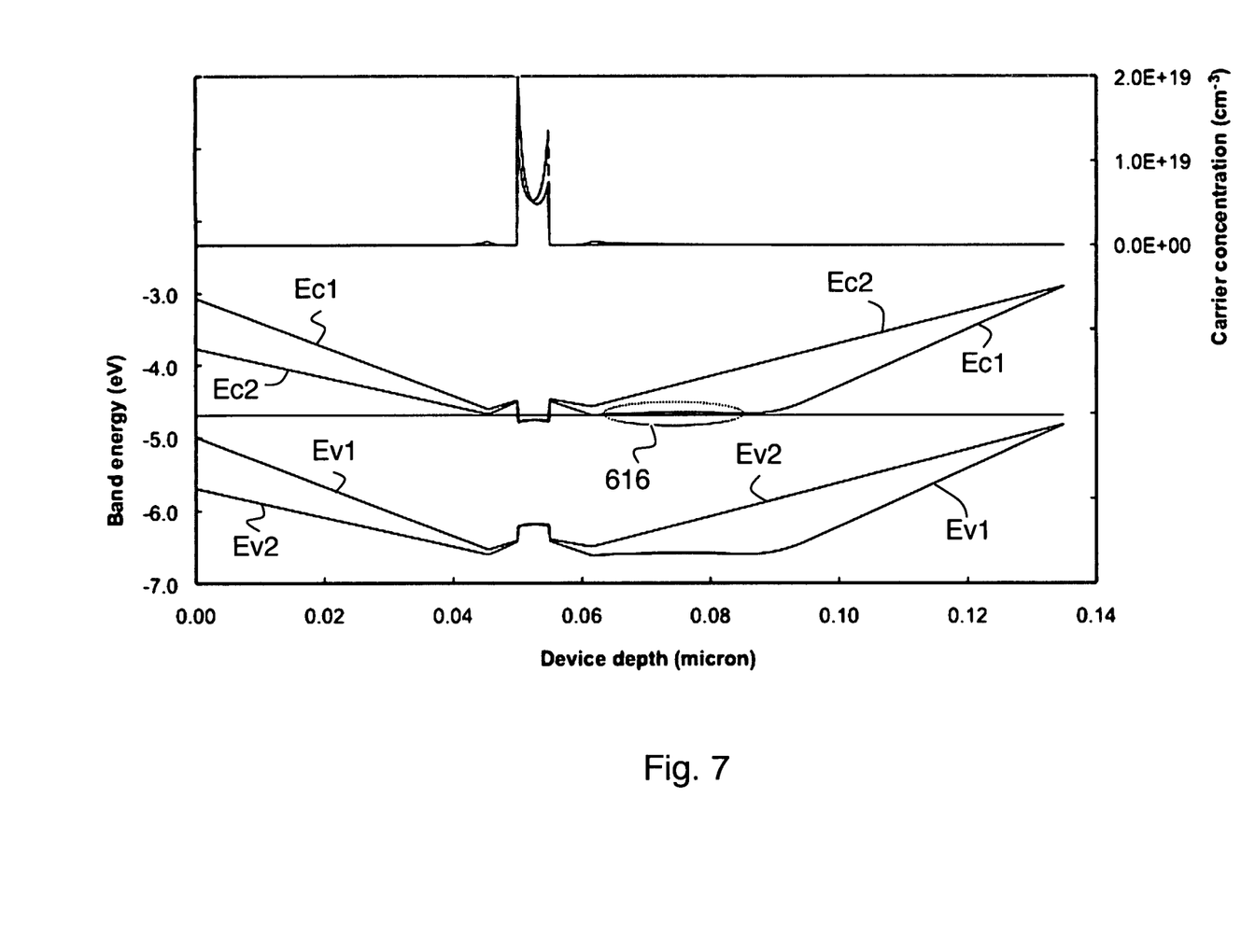
FIG. 7 shows calculated band structures and carrier concentrations for the example of FIG. 6.

FIG. 7 shows calculated band diagrams and carrier concentrations for a buried gate MODFET (as in FIG. 6) in the GaAs/AlGaAs material system. Two 1-D band diagrams for the heterostructure are taken at the gate (line 630 on FIG. 6) and adjacent to the gate (line 640 on FIG. 6). The buried gate is referenced as 616 on FIG. 7. The bands labeled Ev1 and Ec1 are the bands along line 630 (through the gates), and the bands labeled Ec2 and Ev2 are the bands along line 640 (away from the gates). Buried gate 616 will collect electrons generated in, or injected into the substrate 112 in response to ionizing radiation. Note the steep slope of Ec1 tending to force electrons to the buried gate. The collection of charge at the buried gate reduces the conduction in the channel 310, thereby modulating the trans-conductance of the device. The conduction away from the gates is higher (the top gate 106 can be negatively biased to reduce channel conductance at the buried gate), so the device conductance is strongly affected by charge on the buried gate. Here, the gate terminal 106 is used for biasing the device at a proper operating point as opposed to be conventionally used as the sensing terminal. Alternatively 106 can be used to electrically gate the device for synchronization. The accumulated charge on the buried gate can be cleared by applying a proper voltage to the gate 106. This clearing mechanism would not be available in a corresponding MOSFET based structure.

D) Buried Gate MODFET Sensors for Detection of Ionizing Radiation

As indicated above, double-MODFETs having a buried gate are sensitive to ionizing radiation because charge generated by ionizing radiation accumulates on the buried gate, where it effectively modulates the device conductance.

Thus, ionizing radiation can affect the buried gate MODFET conductance via accumulation of charge on a buried gate, or via an effect on the mobility of electrons in the 2DEG. These effects may also occurs simultaneously in practice. Often the conductance will decrease in response to accumulation of charge and/or reduction of 2DEG mobility, however it may also be possible for device conductance to increase in response to ionizing radiation.

There are several approaches for sensing this conductance change. As the energy of the ionizing radiation increases, it is expected that the perturbation of the 2DEG in response to detection of a single high energy event will be more prolonged. Thus, duration of the perturbation is expected to provide energy resolution capability in each of the following specific methods.

C1) Bit Error Rate Detection

By passing a stream of fast digital data bits through the HEMT device and monitoring via a D-type flip flop phase frequency detector (or comparator) the timing and levels, one can use this device for detection of very short lived or rare events. Circuits such as bit error rate detectors, PLL phase frequency detectors, and comparators can all be combined with MODFET/HEMT devices to form an integrated detector system.

As data is transmitted through the device, any perturbation to the 2-D electron gas as a result of X-ray radiation and gamma ray energy transfer in the absorption region (e.g., via impact ionization) will cause the bit transmission to suffer phase delay and/or amplitude reduction. By monitoring or comparing the digital bit transmission through the device we can identify radiation events in <psec levels. For applications which involve Gamma radiation (510 KeV), we can stack one or more high Z bulk absorbing regions in proximity to MODFET detector channels (e.g., using wafer bonding techniques or other conventional means) to provide a path to slow down the gamma rays and allow energy transfer into the MODFET detector substrate.

Figure 8:
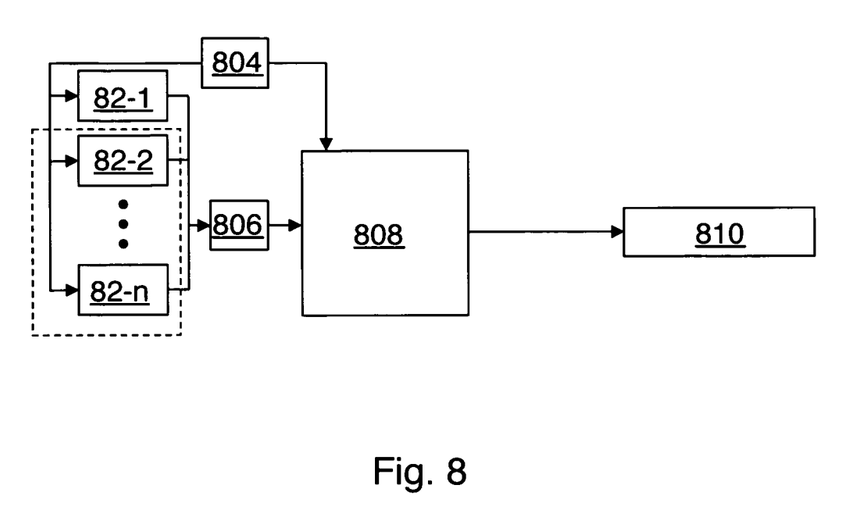
FIG. 8 shows an exemplary approach for performing radiation measurements using sensors according to embodiments of the invention.
Figure 9:
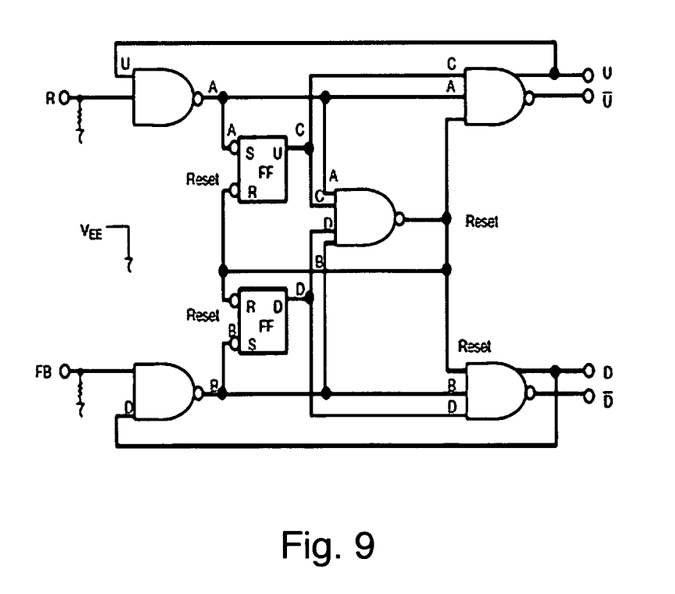
FIG. 9 shows an example of a suitable phase frequency detector for use in the example of FIG. 8.

FIG. 8 schematically shows an example of this approach. A reference data source 804 provides digital data to MODFET 82-1 (and optionally to additional MODFETS 82-2 . . . 82-$n$, for an n-element MODFET sensor array). MODFETs 82-1 . . . 82-$n$ can each include their own front end electronics for amplification. Optionally, further amplification can be provided by a gain stage 806. The MODFET outputs and reference data are provided to a phase frequency detector 808, and the output of phase frequency detector 808 is provided to a processor 810. FIG. 9 shows an exemplary circuit for phase-frequency detector 808 on FIG. 8. Briefly, phase-frequency detector 808 compares the data as passed through the MODFET sensors with the original data, and processor 810 accumulates the results. This bit error rate testing can be performed at high speeds (e.g., 10 GHz, 25 GHz or even higher), which can provide high time resolution for single-event detection.

This bit error test configuration is not only useful in terms of picking up energy of X-ray photon but also reduces background noise since we look for a specific signal pattern defined with bit rate and bit sequence. It is in a way analogous to use of lock in amplifiers and light choppers for weak optical signal spectroscopy.

C2) Pulse Width Modulation

MODFET sensor technology as described herein is also compatible with the pulse width modulation (PWM) approach of US patent publication 2010/0025589, hereby incorporated by reference in its entirety. Briefly, in the PWM approach, time and energy of a detection event can be encoded into a single analog signal pulse.

C3) Pulse Height Comparator

Data that is passed through a MODFET sensor can have its pulse height monitored using a comparator (which can be integrated with the MODFET sensor). Ionizing radiation is expected to perturb the pulse height because of effect of ionizing radiation on the channel conductance.

D) Examples

Commercially available, room temperature, nuclear spectra-graphic grade, bulk grown, semiconductor crystals that can detect X-rays include silicon, germanium, gallium-arsenide, cadmium-telluride, and cadmium$_{1-x}$-zinc$_x$-telluride (x=0.1, 0.2).

The above-described MODFET detector structure can be grown on a spectra-graphic grade absorbing bulk (or inexpensive liquid phase grown) substrate. The available high Z, X-ray spectrographic grade, bulk grown, materials include GaAs, CdTe, and $Cd_{0.9}Zn_{0.1}Te$. Presently, there is no commercial supplier of spectrographic wide-gap $Hg_{0.2}Cd_{0.8}Te$ or $Hg_{0.3}Cd_{0.7}Te$ that is epitaxially or bulk grown.

Below are four examples of the above-described HEMT structure for directly sensing, amplifying, and/or reading out X-rays for CT applications.

D1) HEMT Readout Structure for Si

A silicon-germanium HEMT structure as described above can be grown on bulk spectrographic grade silicon substrates. There are commercial applications for the bulk silicon technology, but bulk Si has not previously been employed for x-ray CT. To increase the stopping power, the silicon substrate can be wafer bonded to higher Z spectrographic grade materials such as CdZnTe.

D2) HEMT Readout Structure for GaAs

GaAs does not have the stopping power needed for efficient X-ray CT, but the technology is extremely mature for building HEMT structures. The above-described device can be manufactured by high volume commercially available GaAs fabrication facilities. The theory of device operation can be verified on GaAs easily.

D3) HEMT Readout Structure for $Cd_{0.9}Zn_{0.1}Te$

There exist MOVCD or MBE grown epitaxial $Hg_{1-x}Cd_xTe$ (x=0.1-0.2) that is lattice matched for $Cd_{0.9}Zn_{0.1}Te$. It is also known as MerCadTel and is a commercially available infrared detector technology. It is possible to grow these $Hg_{1-x}Cd_xTe$ HEMT structures directly on CdZnTe. This is the current commercial production path used for infrared detectors. Even though the device has a very low bandgap (Eg=0.3-0.5 eV), because it so thin (1-2 um for the entire device), it can be operated at room temperature. This technology has the promise to greatly increase the count-rate performance of CdZnTe.

D4) HEMT Readout Structure for Thick Liquid Phase Epitaxially Grown Widegap $Hg_{0.3}Cd_{0.7}Te$ Because of the very high Z of mercury (80), only 1.5 mm thickness is needed to match the stopping power of 3 mm of CdZnTe. This range is in the upper range of possible liquid-phase epitaxial growth of $Hg_{0.3}Cd_{0.7}Te$ on CdZnTe lattice matched substrates.

E) Advantages

E1) High Spatial Resolution Provided by Buried Gate Pixels

The buried gate MODFET configuration provides substantial advantages for radiation detection. Because of the availability of spectroscopic quality CdZnTe, high quality HgCdTe n-DGDHEMT transistors can be grown on top of CZT substrates to provide superior sensors. Doped buried gate regions grown in the thin layers of HgCdTe can define the electrode pattern. The device is very sensitive to the charge that collects on the gate, but is relatively insensitive to the bulk leakage of the substrate. In this way, the device effectively provides a small pixel area similar to what can be obtained with metal electrodes with steering grids. When grown on the substrate, the back contact (e.g., 118 on FIG. 5) of the device can be the cathode contact of the CdZnTe wafer.

E2) On-Chip Integration of Sensors with Front End Electronics

When comparing the HEMT device to an off the chip sensor readout silicon device, it is apparent that a sensor pixel connected to an external front end readout device will have a very large parasitic capacitance because of the connection of the pixel to the front-end readout device. A significant advantage of the present approach is that this parasitic capacitance can be avoided by monolithic integration of MODFET sensor elements with front-end electronics.

The buried gate capacitance $C_{bg}$ can be on the order of 10-30 femto-F, which is significantly smaller than capacitances provided by any hybrid technologies based on CdZnTe interconnected to silicon readout chips. The small capacitances of the sensing structures are a major advantage of active pixel sensors. Combined with the extremely high speed of conduction in the channel, the HEMT structure can drive large amounts of current at GHz speeds into a sensing electrode. These currents then can then drive off-chip circuitry, after receiving significant on-chip gain at very high bandwidths.

E3) Radiation Hardness

The HEMT structures are more radiation hard than silicon MOSFET devices because of the lack of a gate-metal-oxide and therefore do not suffer from threshold voltage shifts formed by deep traps in the MOSFET gate oxide. Many studies have been carried out for Co-60 irradiation (a good test of X-ray hardness) of the structure, and shown device functionality with 10e6 Gray (1e9/rad) in GaAs and silicon.

E4) 1-D and 2-D Sensor Arrays, and Integration

Figure 10:
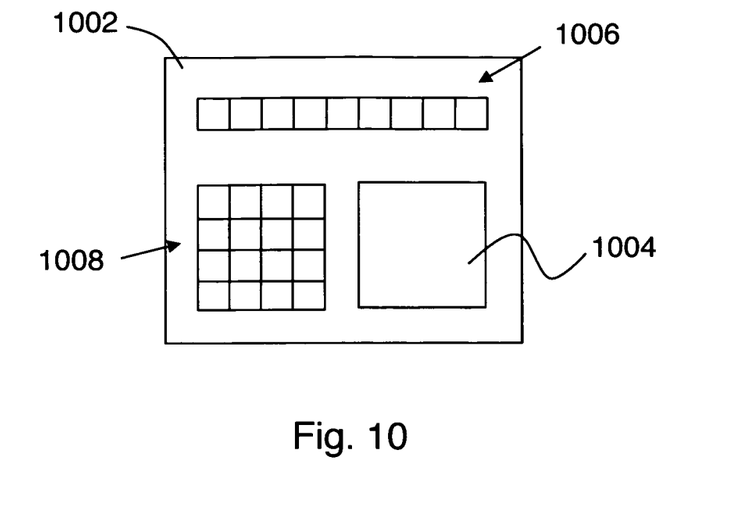
FIG. 10 shows an integrated circuit including sensor elements according to embodiments of the invention.

The present approach is compatible with the use of 1-D and/or 2-D MODFET sensor arrays. Furthermore, MODFET detector elements can be monolithically integrated with any other kind of circuitry (e.g., radiation-hard MODFET electronics). This capability advantageously provides significant flexibility. For example, front end amplifier electronics can be integrated with MODFET sensor elements. As another example, wireless communication circuits can be integrated with MODFET sensors. Combining these two ideas can provide a wireless MODFET sensor head with integrated front end electronics. MODFET sensors can be integrated with pattern generation and clock distribution circuitry, which is especially beneficial for the bit error rate detection approach. FIG. 10 schematically shows an example, where an integrated circuit 1002 includes a 1-D MODFET sensor array 1006 and/or a 2-D MODFET sensor array 1008 in addition to processing and/or front end amplification circuitry 1004. Such 1-D or 2-D sensor arrays can be read out in parallel or sequentially. Multiplexing techniques can be useful for sensor arrays having a large number of elements.

The invention claimed is:

1. Apparatus for high speed detection of ionizing radiation, the apparatus comprising:
    a modulation doped field effect transistor (MODFET) having a channel for current flow between a source and a drain, wherein electrons in the channel form a two-dimensional electron gas (2DEG), and wherein the MODFET includes a first gate to set an operating point of the MODFET for radiation detection; and
    an absorption region disposed at and/or in proximity to the channel and capable of absorbing ionizing radiation;
    wherein the 2DEG provide a conductance that is modulated in response to absorption of ionizing radiation in the absorption region;
    wherein the ionizing radiation has a photon or particle energy of about 20 keV or greater.

2. The apparatus of claim 1, wherein the electrons in the 2DEG have a mobility that is modulated in response to absorption of ionizing radiation in the absorption region.

3. The apparatus of claim 1, wherein the MODFET is a double-heterostructure MODFET, and further comprising a buried second gate disposed in proximity to the channel, wherein charges generated by absorption of ionizing radiation in the absorption region can accumulate on the buried second gate as accumulated charge, and wherein the conductance is modulated in response to the accumulated charge.

4. The apparatus of claim 1, wherein conductance changes caused by incident ionizing radiation are measured via their effect on operation of the MODFET.

5. The apparatus of claim 1, wherein the MODFET and absorption region are of different material systems.

6. A sensor array comprising two or more of the apparatus of claim 1 disposed in a 1-D or 2-D array of sensor pixels.

7. The apparatus of claim 6, wherein the array of sensor pixels is read out in parallel or sequentially.

8. An integrated circuit comprising the apparatus of claim 1.

9. The apparatus of claim 1, wherein the MODFET is implemented in layers of Hg(1-x)Cd(x)Te that are grown lattice-matched to a layer of Cd(1-y)Zn(y)Te that serves as the absorption region.

10. The apparatus of claim 1, wherein the conductance decreases in response to absorption of ionizing radiation in the absorption region.

11. A method for detection of ionizing radiation, the method comprising:
    providing a modulation doped field effect transistor (MODFET) having a channel for current flow between a source and a drain, wherein electrons in the channel form a two-dimensional electron gas (2DEG), and wherein the MODFET includes a first gate to set an operating point of the MODFET for radiation detection; and
    disposing an absorption region at and/or in proximity to the channel that is capable of absorbing ionizing radiation;
    wherein the electrons in the 2DEG provide a conductance that is modulated in response to absorption of ionizing radiation in the absorption region;
    wherein the ionizing radiation has a photon or particle energy of about 20 keV or greater.

12. The method of claim 11, wherein the electrons in the 2DEG have a mobility that is modulated in response to absorption of ionizing radiation in the absorption region.

13. The method of claim 11, wherein the MODFET is a double-heterostructure MODFET, wherein the MODFET further comprises a buried second gate disposed in proximity to the channel, wherein charges generated by absorption of ionizing radiation in the absorption region can accumulate on the buried second gate as accumulated charge, and wherein the conductance is modulated in response to the accumulated charge.

14. The method of claim 11, further comprising measuring conductance changes caused by incident ionizing radiation via their effect on operation of the MODFET.

15. The method of claim 11, further comprising pulse width modulation of detector signals to provide a modulated output signal, wherein pulse width in the output signal is related to one or more incident ionizing radiation parameters.

16. A method of single photon detection of ionizing radiation comprising performing the method of claim 11 for an incident photon.

17. The method of claim 16, wherein variation of a drain-source current in the MODFET is indicative of absorption of the incident photon, and the extent of the variation is indicative of the energy of the incident photon.

18. The method of claim 17, further comprising passing a digital data signal through the MODFET, wherein distortion of the digital data signal is indicative of absorption of the incident photon, and the extent of the distortion is indicative of the energy of the incident photon.

19. The method of claim 11, wherein the conductance decreases in response to absorption of ionizing radiation in the absorption region.

\* \* \* \* \*